United States Patent
Ford et al.

(10) Patent No.: US 7,468,110 B2
(45) Date of Patent: Dec. 23, 2008

(54) HOLLOW CATHODE TARGET AND METHODS OF MAKING SAME

(75) Inventors: Robert B. Ford, West Reading, PA (US); Christopher A. Michaluk, Gilbertsville, PA (US)

(73) Assignee: Cabot Corporation, Boston, MA (US)

( * ) Notice: Subject to any disclaimer, the term of this patent is extended or adjusted under 35 U.S.C. 154(b) by 479 days.

(21) Appl. No.: 11/091,029

(22) Filed: Mar. 28, 2005

(65) Prior Publication Data

US 2005/0167015 A1    Aug. 4, 2005

Related U.S. Application Data

(62) Division of application No. 10/036,338, filed on Nov. 9, 2001, now Pat. No. 6,887,356.

(60) Provisional application No. 60/253,116, filed on Nov. 27, 2000, provisional application No. 60/295,417, filed on Jun. 1, 2001.

(51) Int. Cl.
  *C22F 1/18*   (2006.01)
  *C22F 1/08*   (2006.01)
  *C23C 14/34*   (2006.01)
  *C23C 14/00*   (2006.01)
  *C25B 9/00*   (2006.01)
  *C25B 11/00*   (2006.01)
  *C21D 1/00*   (2006.01)

(52) U.S. Cl. .............. 148/668; 204/298.13; 204/298.12; 148/538; 148/546; 148/547; 148/548; 148/553; 148/554; 148/559; 148/679; 148/684; 148/685

(58) Field of Classification Search .............. 228/155, 228/158
See application file for complete search history.

(56) References Cited

U.S. PATENT DOCUMENTS

| 3,274,814 | A | * | 9/1966 | Dilling ........................... 72/74 |
| 3,800,406 | A | * | 4/1974 | Hagan et al. ................. 228/158 |
| 3,884,793 | A |   | 5/1975 | Penfold et al. ............... 204/298 |
| 4,505,764 | A | * | 3/1985 | Smickley et al. ............. 148/670 |
| 5,171,415 | A |   | 12/1992 | Miller et al. ........... 204/298.09 |
| 5,188,717 | A |   | 2/1993 | Broadbent et al. ..... 204/192.12 |
| 5,244,556 | A |   | 9/1993 | Inoue .................... 204/192.12 |
| 5,336,386 | A | * | 8/1994 | Marx et al. ............. 204/298.12 |

(Continued)

FOREIGN PATENT DOCUMENTS

EP    1 099 777 A1    5/2001

(Continued)

OTHER PUBLICATIONS

Fonte, V., "Flowforming of thin-walled tubes and cylinders", Sep. 1997, Tube International, vol. 16 (80), pp. 389-392.*

(Continued)

*Primary Examiner*—John P. Sheehan
*Assistant Examiner*—Jessee R. Roe

(57) ABSTRACT

Sputtering targets and methods of making sputtering targets are described. The method includes the steps of: providing a sputtering metal workpiece made of a valve metal; transverse cold-rolling the sputtering metal workpiece to obtain a rolled workpiece; and cold-working the rolled workpiece to obtain a shaped workpiece. The sputtering targets exhibits a substantially consistent grain structure and/or texture on at least the sidewalls.

35 Claims, 7 Drawing Sheets

U.S. PATENT DOCUMENTS

| | | | | |
|---|---|---|---|---|
| 5,393,398 | A | | 2/1995 | Sugano .................. 204/298.11 |
| 5,437,778 | A | | 8/1995 | Hedgcoth .............. 204/298.21 |
| 5,529,674 | A | | 6/1996 | Hedgcoth .............. 204/298.21 |
| 5,656,138 | A | | 8/1997 | Scobey et al. .......... 204/192.12 |
| 5,693,197 | A | | 12/1997 | Lal et al. ................. 204/192.2 |
| 5,770,025 | A | | 6/1998 | Kiyota .................... 204/298.2 |
| 5,855,745 | A | | 1/1999 | Manley ................. 204/192.12 |
| 5,865,961 | A | | 2/1999 | Yokoyama et al. ..... 204/192.12 |
| 5,993,621 | A | | 11/1999 | Liu ....................... 204/298.12 |
| 5,997,697 | A | | 12/1999 | Gruenenfelder et al. ..................... 204/192.12 |
| 6,004,656 | A | * | 12/1999 | Gosselin et al. ............. 428/198 |
| 6,030,514 | A | * | 2/2000 | Dunlop et al. .......... 204/298.12 |
| 6,033,536 | A | | 3/2000 | Ichihara et al. .......... 204/192.2 |
| 6,042,706 | A | | 3/2000 | Fu ........................ 204/298.12 |
| 6,063,245 | A | | 5/2000 | Frach et al. ............ 204/192.15 |
| 6,077,407 | A | | 6/2000 | Liehr et al. ............ 204/298.19 |
| 6,083,364 | A | | 7/2000 | Ikeda et al. ............ 204/298.11 |
| 6,113,761 | A | | 9/2000 | Kardokus et al. ...... 204/298.13 |
| 6,210,502 | B1 | * | 4/2001 | Takahashi .................. 148/670 |
| 6,238,494 | B1 | * | 5/2001 | Segal .......................... 148/421 |
| 6,283,357 | B1 | * | 9/2001 | Kulkarni et al. ............. 228/155 |
| 6,323,055 | B1 | * | 11/2001 | Rosenberg et al. ............ 438/77 |
| 6,462,339 | B1 | | 10/2002 | Michaluk et al. ............ 250/310 |

FOREIGN PATENT DOCUMENTS

| | | |
|---|---|---|
| JP | 06-158297 | 6/1994 |
| JP | 11-350120 | 12/1999 |
| JP | 2000-104164 | 4/2000 |
| JP | 2000-256843 | 9/2000 |
| JP | 2002-161360 | 4/2002 |
| WO | WO 00/31310 | 6/2000 |

OTHER PUBLICATIONS

Clark J. B. et al., "Influence of Transverse Rolling on the Microstructural and Texture Development in Pure Tantalum", Metallurgical Transactions A (Physical Metallurgy and Materials Science), Aug. 1992, USA, vol. 23A, No. 8, pp. 2183-2191, XP001108813.

Partial International Search Report for PCT/US01/43376.

C. Pokross, *Controlling the Texture of Tantalum Plate, Journal of Metals*, Oct. 1989, pp. 46-49.

C.A. Michaluk, D.B. Smathers, and D. P. Field, *Affect of Localized Texture of the Sputter Performance of Tantalum*, Proceedings of the Twelfth International Conference on Texture of Materials., J.A. Szpunar (ed.), *NRC Research Press*, Ottawa, 1999, pp. 1357-1362.

C.A. Michaluk, *Factors Affecting the Mechanical Properties and Texture of Tantalum*, Cabot Performance Materials, TMS Annual Meeting, Anaheim, CA, (Feb. 4-7, 1996).

C.A. Michaluk, *Masters Thesis*, Drexel University, 1993.

Gray III, S.R. Bingert, S.I. Wright, and S.R. Chen, *Influence of Tungsten Alloying Additions on the Mechanical Properties and Texture of Tantalum, Material Research Society Symposium Proceedings*, vol. 322, Materials Research Society, 1994, pp. 407-412.

J.B. Clark, R.K. Garrett, Jr., T.L. Jungling, and R.I. Asfahani, *Influence of Transverse Rolling on the Microstructural and Textural Development in Pure Tantalum, Metallurgical Transactions*, A, 23A, pp. 2183-2191.

J.B. Clark, R.K. Garrett, Jr., T.L. Jungling, R.A. Vandermeer, and C.L. Vold, *Effect of Processing Variables on the Texture and Texture Gradients in Tantalum, Metallurgical Transactions* A, 22A, pp. 2039-2048.

P. Kumar (eds.), *Factors Affecting the Mechanical Properties and Texture of Tantalum The Minerals, Metals, and Materials Society*, Warrendale, PA, 1996, pp. 205-217.

S.I. Wright, S.R. Bingert, and M.D. Johnson, *Effect of Annealing Temperature on the Texture of Rolled Tantalum and Tantalum 10 wt.% Tungsten, Utungsten and Refractory Metals 2*, A. Bose and R.J. Dowding (eds.), Metal Powder Industries, Princeton, 1995, pp. 501-508.

Translation of first Office Action (Notice of Reasons for Rejection) in counterpart Japanese Patent Application No. 2002-545213 dated Dec. 18, 2007.

* cited by examiner

Grain Size distribution and data – Sample Ta A 1050

Grain Size distribution and data — Sample Ta U 1100

Grain Size distribution and data – Sample Nb A 1250

Grain Size distribution and data – Sample Nb u 1100

HOLLOW CATHODE TARGET AND METHODS OF MAKING SAME

The present application is a divisional application of U.S. patent application Ser. No. 10/036,338, filed Nov. 9, 2001, now U.S. Pat. No. 6,887,356, which claims the benefit under 35 U.S.C. § 119(e) of prior U.S. Provisional Application Patent Application No. 60/253,116 filed Nov. 27, 2000, and 60/295,417 filed Jun. 1, 2001, which are incorporated in their entirety by reference herein.

BACKGROUND OF THE INVENTION

The present invention relates to a sputtering target and to methods of making the same.

Various sputtering techniques are used in order to affect the deposition of the film over the surface of the substrate. Deposited metal films, such as metal films on a thin film semiconductor device can be formed by a magnetron sputtering apparatus or other sputtering techniques. The magnetron sputtering apparatus induces plasma ions of a gas to bombard a target causing surface particles of the target material to be ejected therefrom, and to be deposited as a film or layer on the surface of a substrate. Conventionally, a sputtering source in the form of a planar disc or rectangle is used as the target, and ejected atoms travel along a line-of-sight trajectory to deposit on top of a wafer whose deposition face is parallel to the erosion face of the target. A hollow cathode magnetron (HCM) sputtering target in the shape of an inverted crucible or cup can be used as the target material. An inner chamber or sputtering cavity defined by the target contains a plasma that erodes the interior wall surfaces of the target in the manner mentioned above. An attribute of a sputtering system employing a hollow cathode target is its ability to deposit a film that is able to fill deep and narrow channels of the substrate. The above is accomplished when target atoms, ejected from the interior walls of the target, become ionized as they pass through the plasma. Magnetic fields then traject the ions in a direction perpendicular to the substrate.

DC magnetron sputtering or standard magnetron sputtering involves the well-known principles of "crossed-field" electrical gas discharges to give very high deposition rates, as well as other highly desirable parameters. The high deposition rates simply result from the fact that magnetically enhanced discharge plasmas allow very high power density under available conditions. With this technique, high deposition rates at low pressures are typical, and good uniformity and step coverage are possible. It is also possible to use RF (radio-frequency) alternating voltage instead of DC voltage in magnetron sputtering. A disadvantage of the above technique, however, is that the good deposition uniformity that it provides is brought about at the expense of very non-uniform erosion of the target. Thus, target life suffers.

Examples of sputtering devices and methods are described in U.S. Pat. No. 5,693,197 to Lal et al, U.S. Pat. No. 5,997,697 to Guenenfelder et al, U.S. Pat. No. 5,865,961 to Yokoyama et al, U.S. Pat. No. 5,855,745 to Manley, U.S. Pat. No. 6,033,536 to Ichihara et al, U.S. Pat. No. 5,529,674 to Hedgcoth, U.S. Pat. No. 5,656,138 to Scobey et al, U.S. Pat. No. 6,063,245 to Frach et al, U.S. Pat. No. 5,437,778 to Hedgcoth, U.S. Pat. No. 6,077,407 to Liehr et al, U.S. Pat. No. 5,770,025 to Kiyota, U.S. Pat. No. 5,188,717 to Broadbent et al, U.S. Pat. No. 5,171,415 to Miller et al, U.S. Pat. No. 6,083,364 to Ikeda et al, U.S. Pat. No. 3,884,793 to Penfold et al, and U.S. Pat. No. 5,393,398 to Sugano, all of which are incorporated herein by reference in their entireties.

Tantalum hollow cathode magnetron (HCM) sputtering targets are conventionally fabricated using crucibles that have been manufactured by welding and/or deep drawing. These techniques tend to impart metallurgical inhomogeneities to the cathode, which detrimentally impact sputtering performance. For example, weld beads and the surrounded heat-effected zone exhibit a grain structure and texture that differs from that of the bulk material. Such metallurgical inhomogeneities may create stray magnetic fields that impede the sputtering process. Likewise, deep drawing or spinning of annealed or stress-relieved plate may generate minor amounts of strain that are not uniformly distributed about the workpiece, resulting in a variable annealing response and/or sputtering erosion. Consequently, one of the disadvantages of HCM targets produced as described above is that they erode unevenly, resulting in a low number of acceptable wafers being produced from each tantalum HCM target due to a non-uniform deposition of target material on a substrate.

In designing the target and its associated magnetic field, two main objectives are a uniform erosion of the target and a uniform deposition of target material on the substrate.

Sputtering techniques that attempt to address the above objectives involve the use of rotating magnet DC magnetron sputtering, or of additional stationary components to be used in the sputtering device. The first mentioned technique addresses the question of material utilization efficiency by moving the magnet structure over the surface of the target in order to simultaneously obtain uniform material utilization and adequate step coverage. An example of the first technique is described in U.S. Pat. No. 5,770,025 to Kiyota, U.S. Pat. No. 5,188,717 to Broadbent et al, U.S. Pat. No. 5,171,415 to Miller et al, and U.S. Pat. No. 6,083,364 to Ikeda et al., all incorporated in their entirety herein by reference. An example of the second technique is described in U.S. Pat. No. 5,393,398 to Sugano, where a particle interceptor is disposed between the target and the substrate to yield a uniform deposited layer on the substrate. However, the above techniques are disadvantageous in that they involve the need to use complex and/or expensive equipment with a sputtering apparatus.

All the patents and publications mentioned above and throughout are incorporated in their entirety by reference herein.

SUMMARY OF THE INVENTION

The present invention relates to a sputtering target, such as a HCM target, preferably exhibiting substantially uniform grain structure and texture at least on the sidewalls thereof. Preferably, any strain within the sputtering target is substantially uniformly distributed throughout at least the sidewalls thereof. The sputtering target preferably exhibits substantially uniform sputtering erosion.

The present invention is also directed to a method of making a hollow cathode magnetron sputtering target that is suitable for causing a uniform film of sputtered material to be deposited onto a substrate, and to a sputtering target made according to the method: The present invention may be used in different embodiments suitable for the deposition of a thin film onto substrates of different geometries. The target of the present invention preferably erodes evenly during operation and does not require moving parts or additional components, thus providing a simple, cost-effective, and reliable magnetron sputtering system.

The present invention further provides a method of making a sputtering target involving the steps of: providing a sputtering metal workpiece made of a valve metal; transverse cold-rolling the sputtering metal workpiece to obtain a rolled workpiece; and cold-working the rolled workpiece to obtain a shaped workpiece. Optionally, the method includes the further step of annealing the sputtering metal workpiece between the steps of transverse cold-rolling and cold-working.

The present invention further includes within its scope a sputtering target assembly containing the sputtering target described above, and further including at least one of a top portion made of a non-sputtering or sputter-resistant material attached to the sidewalls of the sputtering target, and an outer shell made of a non-sputtering material, wherein the sputtering target is secured to the outer shell.

The present invention further relates to targets, such as HCM targets.

It is to be understood that both the foregoing general description and the following detailed description are exemplary and explanatory only and are only intended to provide a further explanation of the present invention, as claimed. The accompanying drawings, which are incorporated in and constitute a part of this application, illustrate several exemplary embodiments of the present invention and together with description, serve to explain the principles of the present invention.

BRIEF DESCRIPTION OF THE DRAWINGS

The present invention may be more fully understood with reference to the accompanying figures. The figures are intended to illustrate exemplary embodiments of the present invention without limiting the scope of the invention.

DETAILED DESCRIPTION OF THE PRESENT INVENTION

The present invention provides a method of making a sputtering target. The method includes providing a sputtering metal workpiece made of a valve metal, preferably tantalum or niobium or alloys thereof. Thereafter, the sputtering metal workpiece is transverse cold-rolled to obtain a rolled workpiece. The rolled workpiece is then cold-worked to obtain a shaped workpiece. According to the present invention, the sputtering metal workpiece may optionally be annealed between the steps of transverse cold-rolling and cold-working. In certain embodiments, this optional annealing step is avoided.

The present invention further encompasses a sputtering target. The sputtering targets preferably exhibit a substantially consistent or uniform grain structure and/or texture at least on the sidewalls thereof. Any strain within the sputtering target preferably is substantially uniformly distributed throughout at least the sidewalls of the target. The sputtering target thereby preferably exhibits substantially uniform sputtering erosion.

As an option, the present invention further includes within its scope a sputtering target assembly containing the sputtering target described above, and further including at least one of a top portion made of a non-sputtering material attached to the sidewalls of the sputtering target, and an outer shell made of a non-sputtering material. The sputtering target is secured to the outer shell.

Figure 1:
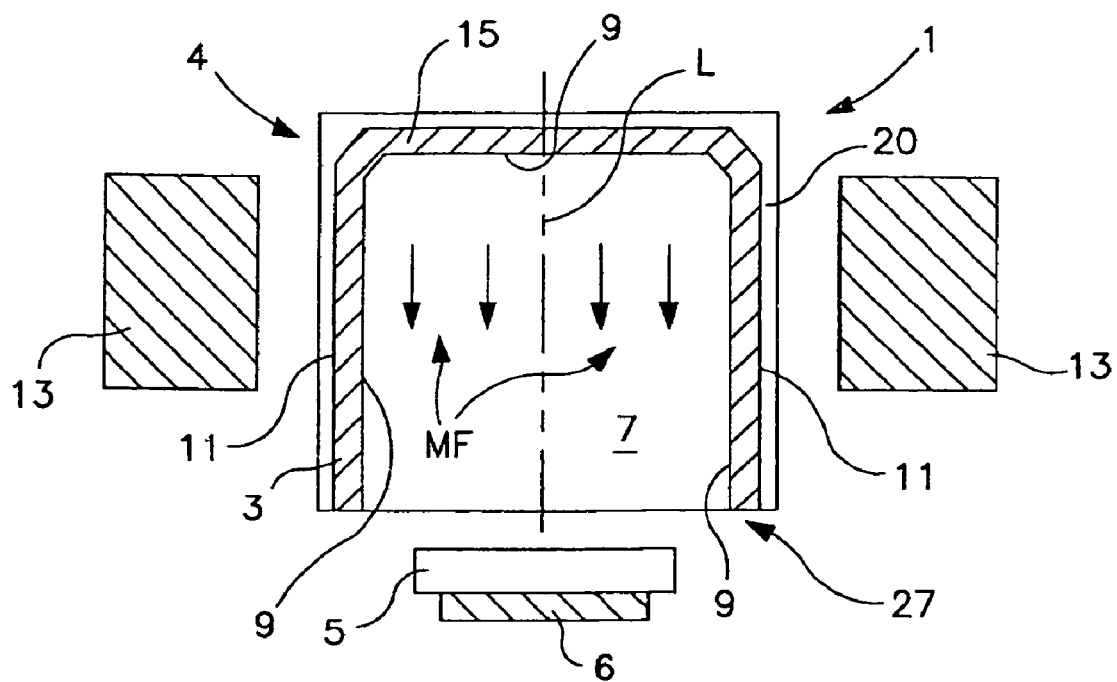
FIG. 1 is a schematic representation of an embodiment of a magnetron sputtering apparatus using a sputtering target made according to a method of the present invention.

Referring now to FIG. 1, an embodiment of a magnetron sputtering apparatus using a sputtering target made of the present invention is exemplified in schematic form. As depicted in FIG. 1, a magnetron sputtering apparatus 1 includes a sputtering target 3 in the form of a crucible, that is, of an elongated hollow cup-shaped member, as shown in perspective in FIG. 2. Sputtering target 3 includes interior walls 9, exterior walls 11, and a top portion 15. In FIG. 1, the sputtering target 3 is shown as having been placed in an outer shell or liner 20 to form a sputtering assembly 4 as shown. Apparatus 1 further includes a substrate 5 disposed on a substrate holder 6 located adjacent to the sputtering cavity 7 defined by interior walls 9 of sputtering target 3. Adjacent the exterior walls 11 of sputtering target 3 are disposed means 13, such as permanent magnets or electromagnets, for providing magnetic flux lines MF that are substantially parallel to the longitudinal axis L of the sputtering target and continuous with the interior walls 9 thereof. Magnetic flux lines MF create a physical trap to contain the electrons of the glow discharge from sputtering target 3, as would be readily recognized by one skilled in the art. Means 13 may take any variety of forms, such as a plurality of bar magnets, a plurality of toroidal magnets, or any other means for generating the magnetic flux lines MF as shown in FIG. 1. The manner of operation of an apparatus such as apparatus 1 in FIG. 1 is within the knowledge of one skilled in the art. The sputtering process, performed with the apparatus of FIG. 1 in a vacuum chamber in the presence of an inert gas, such as argon (Ar), involves the ionization of the molecules of the inert gas in cavity 7. This ionization is brought about under the effect of an electric field created by applying a voltage across the target 3 and the substrate holder 6 to produce the plasma or ionized inert gas molecules. The plasma ions then impact the inner walls 9 of the sputtering target 3, causing atoms to be ejected from the inside surface of the target. Ejected target atoms then travel through the plasma, during which a substantial fraction of the ejected target atoms themselves become ionized by the plasma. Once ionized, the target anions are directed to travel along a trajectory perpendicular to the surface of substrate 5 by an external magnetic field, after which they are deposited on the substrate to form a deposited layer thereon. According to the present invention, sputtering target 3 is formed such that it provides good deposition uniformity with respect to the substrate while further eroding substantially uniformly without the need to use moving parts in the sputtering apparatus such as rotating magnets or substrates, and without the need for additional components as part of the sputtering apparatus. While not necessary, these techniques can be optionally used in the present invention.

The present invention preferably provides a sputtering target suitable for a HCM assembly that has a substantially homogenous microstructure at least about its interior sidewalls, that is, a substantially consistent grain structure and texture at least about its interior sidewalls. The present invention further provides a method of forming the above sputtering target.

Figure 5:
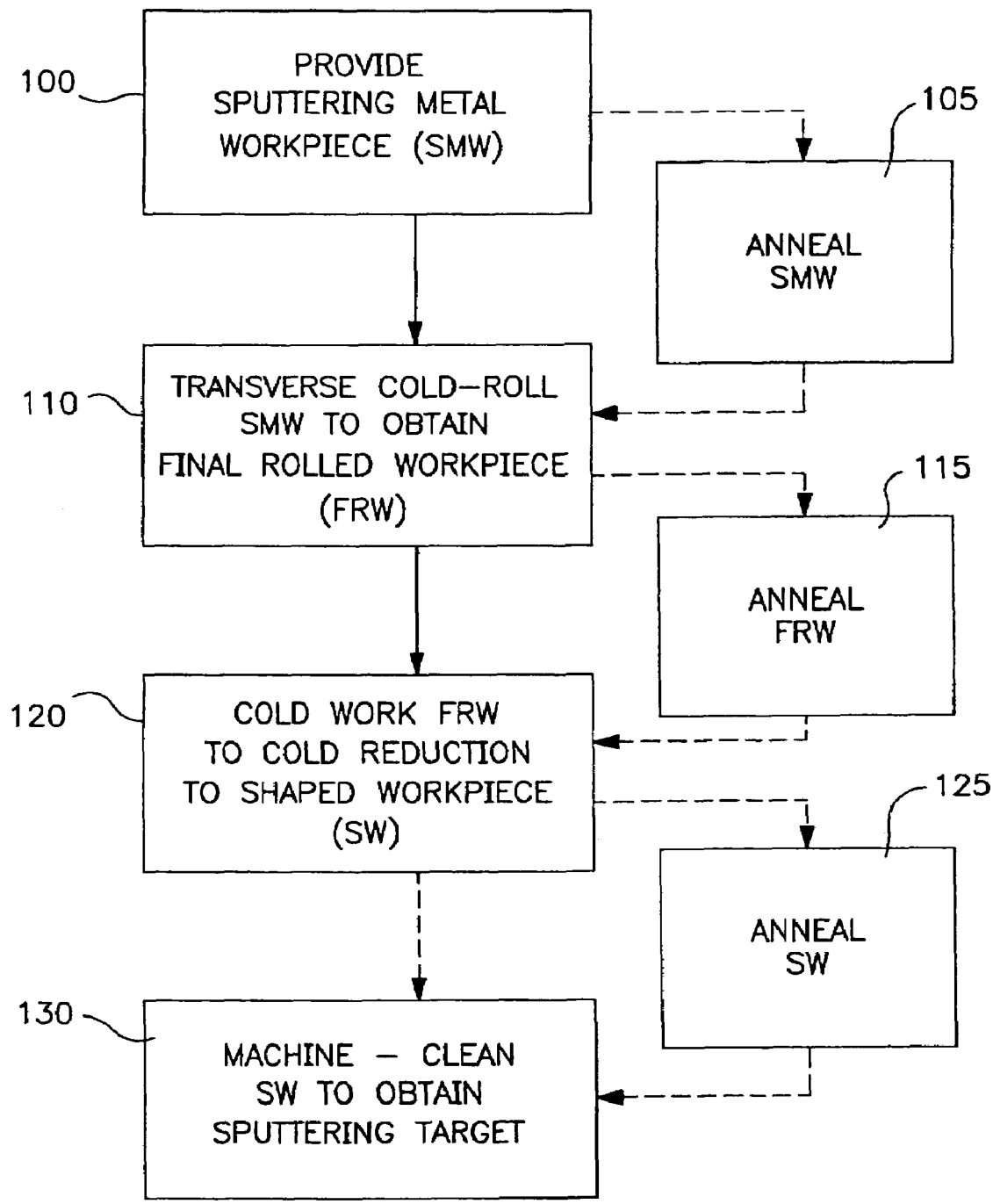
FIG. 5 is a flowchart showing method steps according to a method of the present invention.
Figure 6:
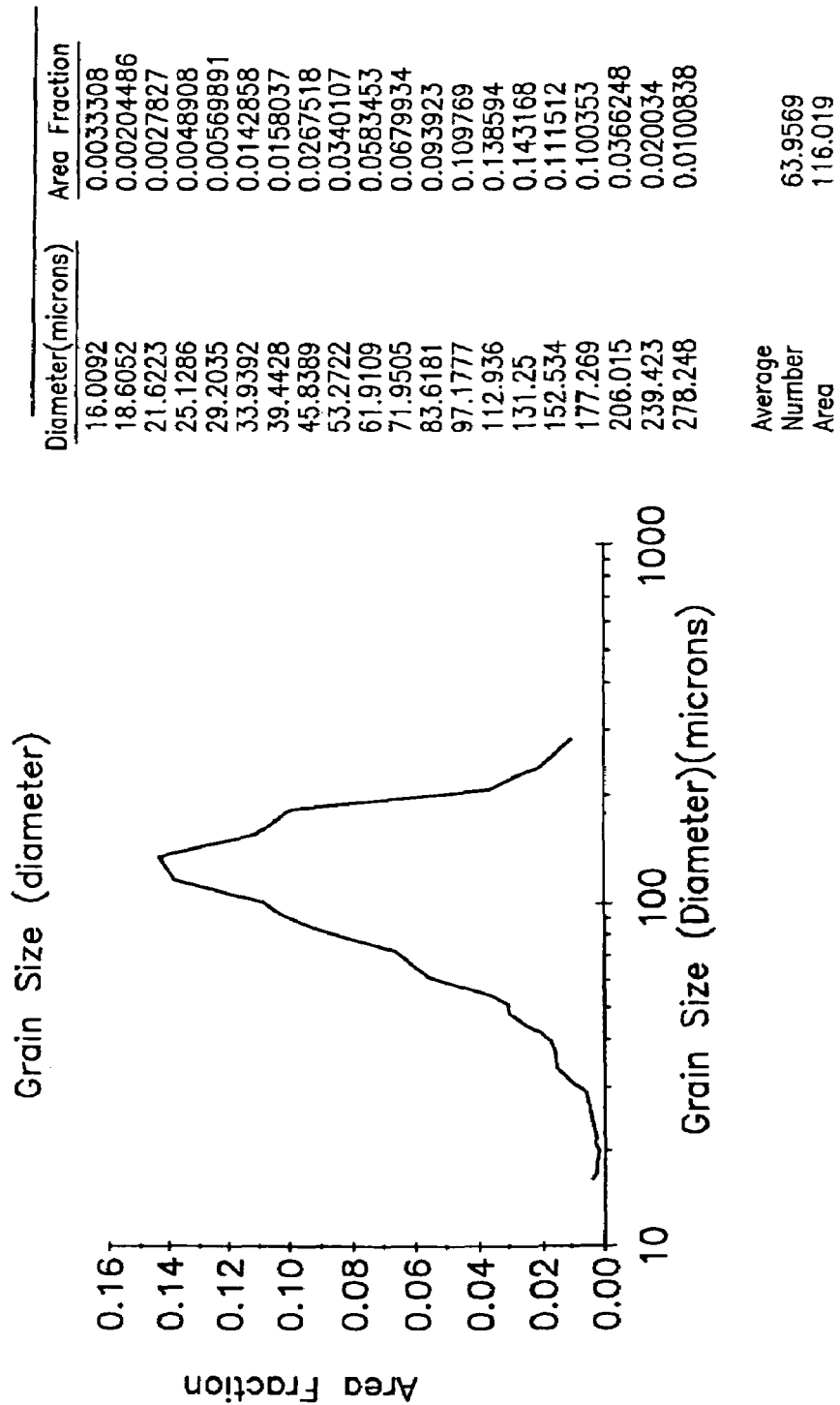
FIG. 6-9 are graphs showing grain size distribution plots of the samples used in the examples.
Figure 7:
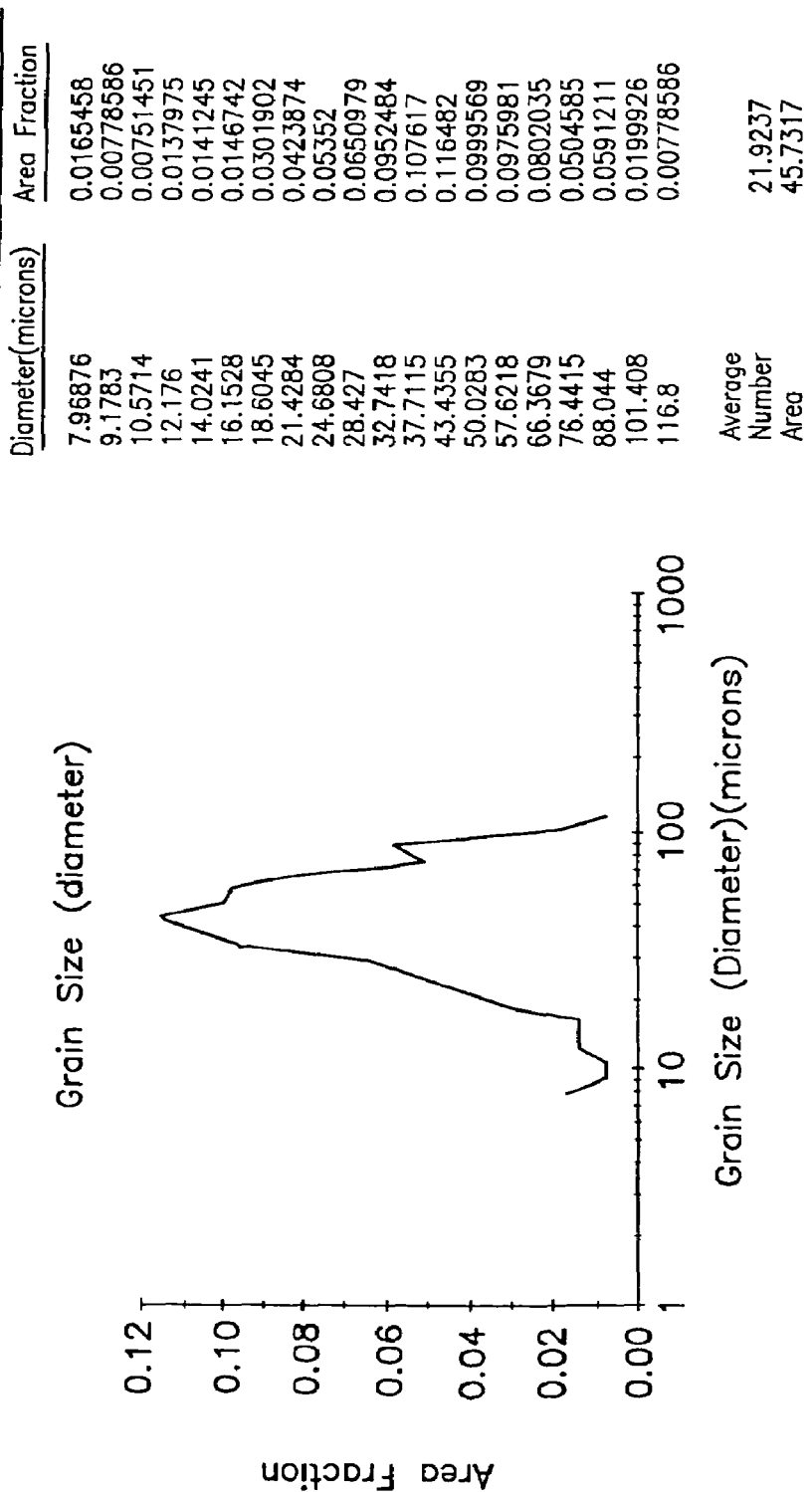
Figure 8:
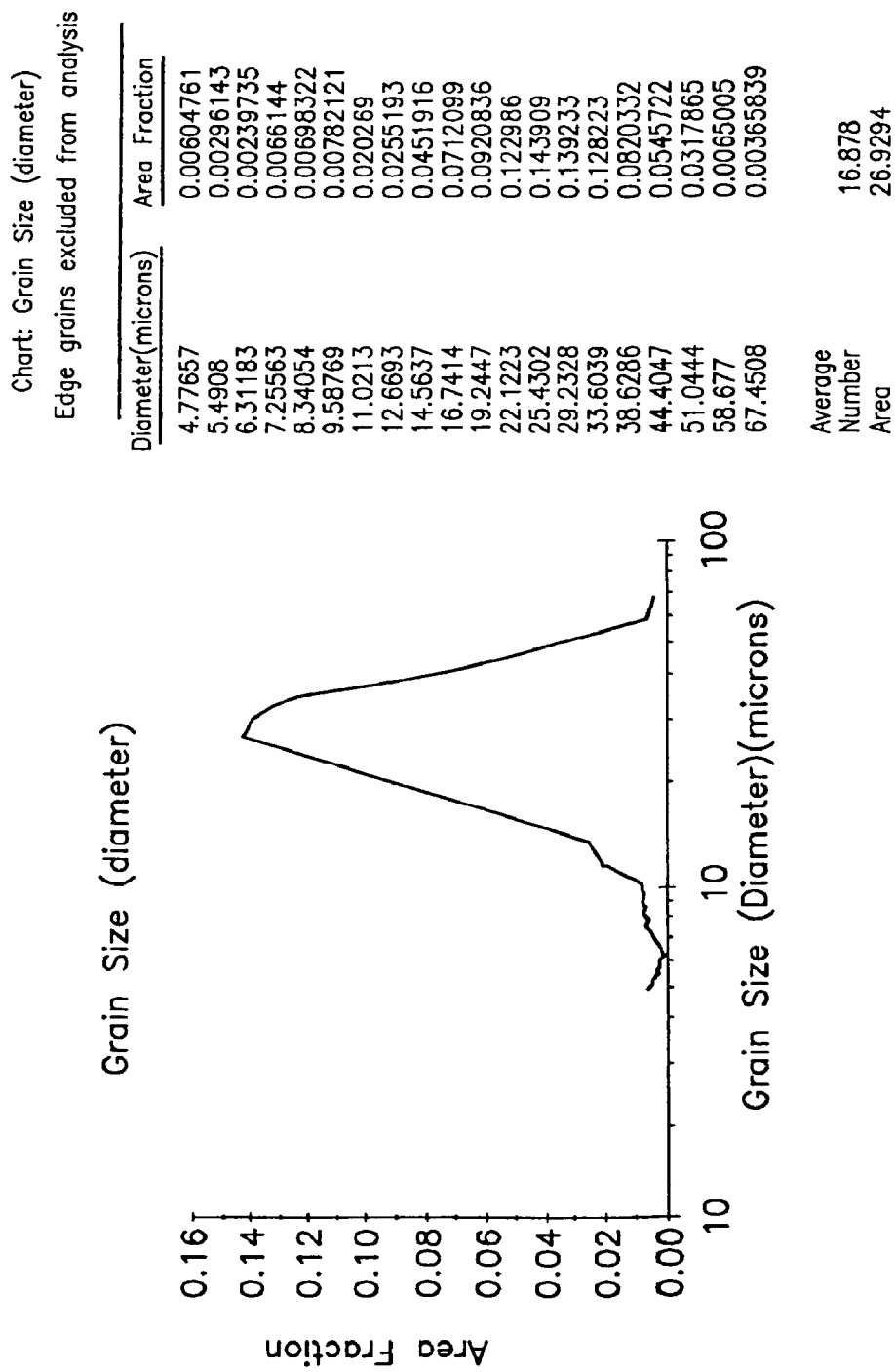
Figure 9:
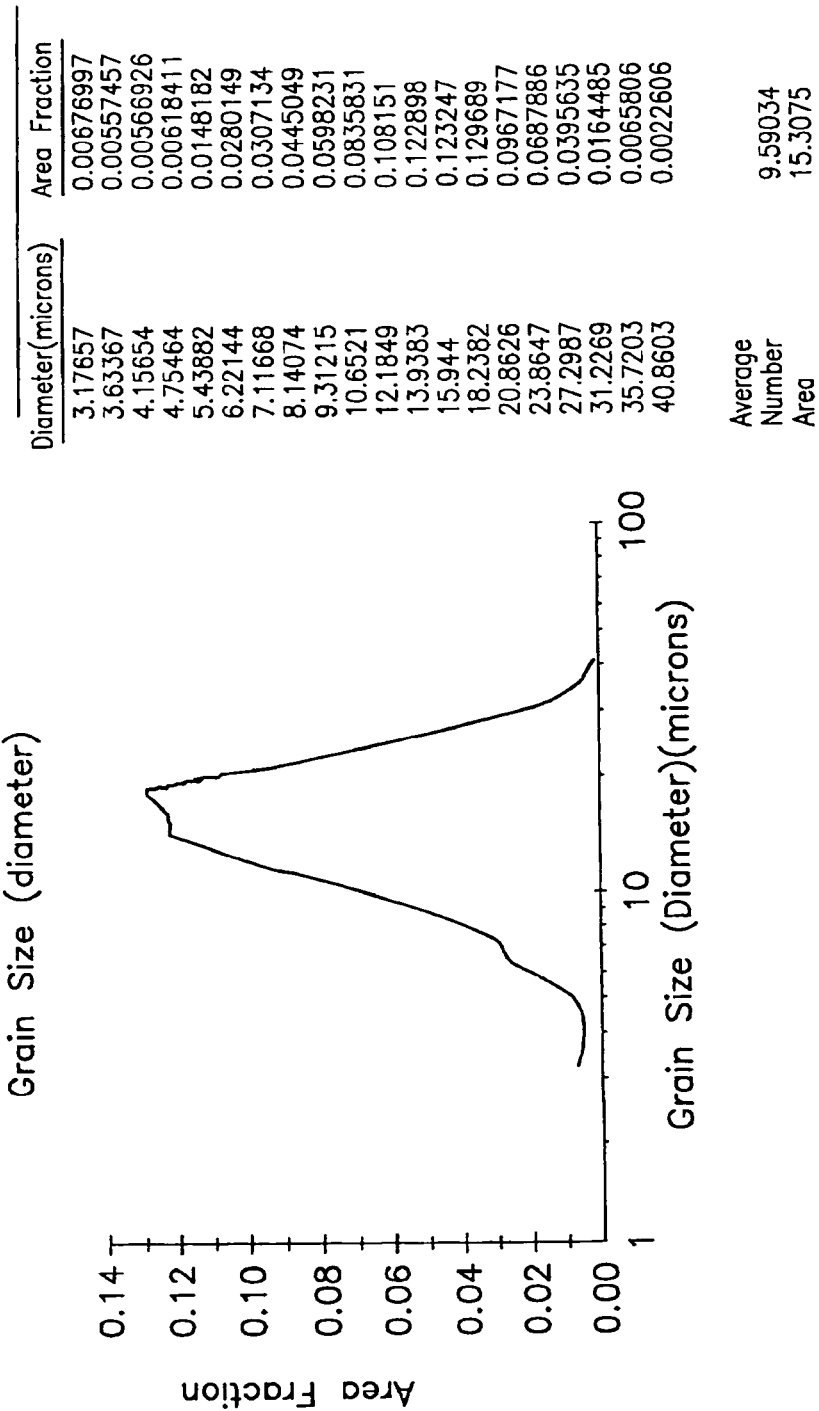

An embodiment of the method of the present invention is depicted in flowchart form in FIG. 5, wherein some optional steps have been indicated by broken lead arrows. According to the present invention, as seen in FIG. 5, a sputtering metal workpiece made of a valve metal, such as niobium (Nb), tantalum (Ta), aluminum (Al), titanium (Ti), vanadium (V), zirconium (Zr), or alloys thereof (hereinafter "sputtering metal") is provided at step 100. For purposes of this invention, valve metal includes copper (Cu). Prior to step 100, any of the standard, conventional steps can be used, such as melting and flat forging and the like. To provide the sputtering metal workpiece, an ingot made of a valve metal is first preferably forged flat, cut into slabs and machine-cleaned. The steps of forging the sputtering metal flat, cutting it into slabs and machine-cleaning to provide the sputtering metal workpiece are conventional, such as described in C. Pokross, Controlling the Texture of Tantalum Plate, Journal of Metals, October 1989, pp.46-49; J. B. Clark, R. K. Garrett, Jr., T. L. Jungling, and R. I. Asfahani, Influence of Transverse Rolling on the Microstructural and Textural Development in Pure Tantalum, Metallurgical Transactions A, 23A, pp. 2183-2191, and the like, all incorporated herein in their entirety by reference.

Figure 4A:
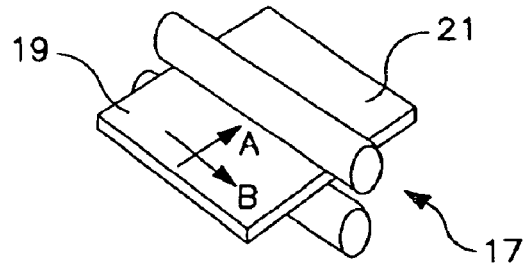
FIGS. 4*a* and 4*b* are schematic representations of the step of transverse cold-rolling according to a method of the present invention.
Figure 4B:
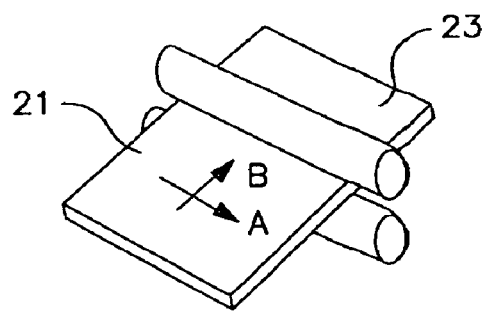

The sputtering metal workpiece is then used as a "rolling workpiece" and transverse cold-rolled at step 110 to a predetermined cold-rolling thickness to obtain a rolled workpiece. Preferably, the predetermined cold-rolling thickness is from about ¼ inch to about 1 inch or more, though other thicknesses can be easily used. "Rolling workpiece" in the context of the present invention designates the workpiece through its successive stages of being transverse cold-rolled, from the first rolling step where the sputtering metal workpiece is used until the rolled workpiece with the predetermined cold-rolling thickness is produced. In the step of transverse cold-rolling, as seen in FIGS. 4a and 4b, a rolling workpiece 19 is rolled by a conventional cold-rolling device 17 in a direction perpendicular to the axis (center-line) of the ingot defined as "A" to form another, thinner rolling workpiece 21. Thereafter, each successive rolling workpiece 21 is rotated 90 degrees then cold-rolled in a direction parallel to the ingot center line until it reaches the predetermined thickness. Preferably, the cold-rolling is first effected in a first direction "A" a number of times, and thereafter continued in a second direction "B" perpendicular to direction "A" a number of times until the rolling workpiece reaches the predetermined cold-rolling thickness for yielding a rolled workpiece 23 as seen in FIG. 4b. Preferably, the cold-rolling in the "A" direction imparts a true strain of about −1.3, and cold rolling in the "B" direction imparts a true strain of about −1.4. The transverse cold-rolling of the rolling workpiece uniformly hardens the workpiece and promotes favorable annealing response. The techniques described in J. B. Clark, R. K. Garrett, Jr., T. L. Jungling, and R. I. Asfahani, Influence of Transverse Rolling on the Microstructural and Textural Development in Pure Tantalum, Metallurgical Transactions A, 23A, pp. 2183-2191; and J. B. Clark, R. K. Garrett, Jr., T. L. Jungling, R. A. Vandermeer, and C. L. Vold, Effect of Processing Variables on the Texture and Texture Gradients in Tantalum, Metallurgical Transactions A, 22A, pp. 2039-2048 can be used and these articles are incorporated herein in their entirety by reference.

Preferably, the sputtering metal workpiece is annealed at step 105, as indicated by the broken lead arrows, before the step of transverse cold-rolling described above. The annealing is preferably done in a vacuum of $5\times10^{-4}$ torr or higher, and at a sufficient temperature and for a sufficient time to assure partial to complete recrystallization of the flat-forged rolling slab. Preferably, the annealing temperature is from about 950° C. to about 1300° C., and preferably for about two hours, though other annealing temperatures and/or times can be used. This step of annealing advantageously allows for any heavily work-hardened grains to be recrystallized or recovered, which, in turn, enables stresses imparted by subsequent heavy cold-rolling of the finished plate be distributed in a more efficient manner, and enhances the microstructural and textural homogeneity in the cold-rolled and annealed plate. Intermediate annealing techniques used during the processing of tantalum and which can be used here are described in J. B. Clark, R. K. Garrett, Jr., T. L. Jungling, and R. I. Asfahani, Influence of Transverse Rolling on the Microstructural and Textural Development in Pure Tantalum, Metallurgical Transactions A, 23A, pp. 2183-2191; and C. A. Michaluk, Factors Affecting the Mechanical Properties and Texture of Tantalum, Tantalum, E. Chen, A. Crowson, E. Lavernia, W. Ebihara, and P. Kumar (eds.). The Minerals, Metals, and Materials Society, Warrendale, Pa., 1996, pp. 205-217; C. A. Michaluk, D. B. Smathers, and D. P. Field, Affect of Localized Texture on the Sputter Performance of Tantalum, Proceedings of the Twelfth International Conference on Textures of Materials, J. A. Szpunar (ed.), NRC Research Press, Ottawa, 1999, pp. 1357-1362, all incorporated herein in their entirety by reference.

In one embodiment, after the transverse rolling step 110, the final rolled workpiece (FRW) may be annealed or stress relieved in step 115 to soften the FRW and improve the formability of the FRW. The stress relieving or annealing is preferably done in a vacuum of $5\times10^{-4}$ torr or higher, and at a sufficient temperature and for a sufficient time to assure recovery or complete recrystallization of the FRW. Preferably, the stress relieving temperature is from about 600° C. to about 850° C., and annealing temperature is from about 950° C. to about 1300° C., though other temperatures can be used. The stress relieving and annealing time is preferably for about two hours, though other times can be used. Another advantage of annealing the rolled workpiece between the steps of traverse cold-rolling and cold-working is that, by virtue of its lowered flow stress, the shaped workpiece presents an improved surface finish, largely because it can be shaped much more easily than its un-annealed counterpart (i.e. its counterpart corresponding to the shaped workpiece where the rolled workpiece is not annealed at step 115). Thus, annealing at step 115 advantageously decreases the requirement for the step of machine-cleaning the shaped workpiece at step 130 as the shaped workpiece may already have an acceptable surface finish as required by the original equipment manufacturer (OEM).

In a second embodiment of the present invention, the rolled workpiece is not annealed after the step of transverse cold-rolling and before the step of cold-working into the predetermined target shape. This avoidance of the annealing step prevents the relaxing of the heavy amount of cold work imparted during transverse rolling of the plate prior to forming. Since the FRW retains the cold work imparted from transverse rolling, the average amount of true strain contributed to the workpiece by forming would be preferably less than −0.2. Therefore, the total strain along the length of the workpiece will not vary to significantly effect the annealing response of the shaped workpiece, and annealing of the shaped workpiece will produce a fine grain structure.

Figure 2:
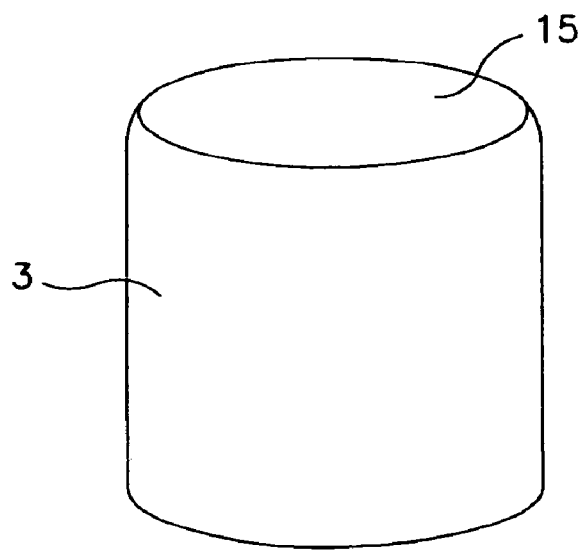
FIG. 2 is a perspective view of the sputtering target of FIG. 1.
Figure 3:
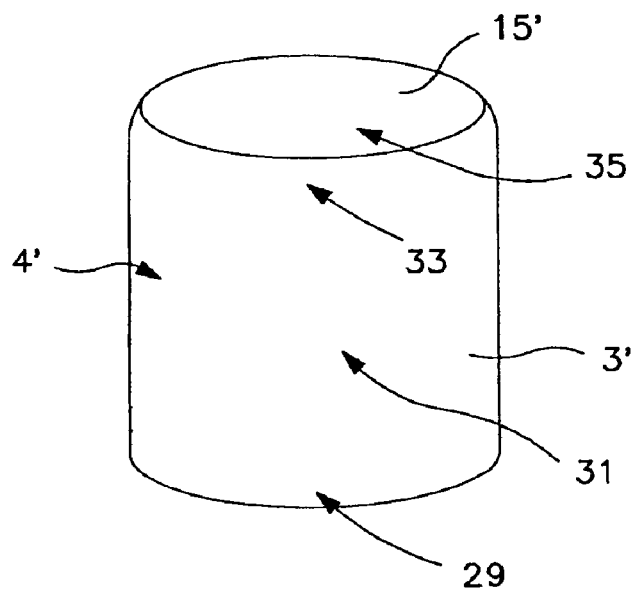
FIG. 3 is a view similar to FIG. 2 showing an embodiment of a sputtering target assembly made according to the present invention.

After the step of transverse cold-rolling and optional stress relieving or annealing (115), the workpiece is used as a blank and formed at step 120 into a predetermined target shape corresponding to the shape of the sputtering target. This step of cold-working preferably involves deep-drawing and/or it may involve spin-forming (e.g., flow forming) the rolled workpiece into the shaped workpiece such that a minimum amount of strain (e.g., minimum strain of about −2.5 in the workpiece) is imparted into the sidewall of the shaped workpiece (SW) after forming. By limiting the amount of strain imparted in the sidewall during operation 120, the severity of non-uniform strains and strain gradients are preferably minimal and would have a lesser influence on metallurgical properties of the finished sputtering target. Preferably, the predetermined target shape corresponds to a cup-shape or cylindrical shape, as shown in FIGS. 2 and 3. The general locations of the base (35), the radius (33), the mid wall (31) and the top wall (29) of the target are shown in FIG. 3. The shape of the sputtering target according to the present invention need not necessarily be cylindrical or cup-shaped, and the cross-section of the sputtering target in a direction perpendicular to the longitudinal axis L need not necessarily be circular.

The cold-working used in the processes of the present invention is preferably a multi-directional cold-working which preferably leads to a multitude of benefits such as a fine and/or uniform grain size and/or a good texture. This multi-directional cold-working is preferably accomplished by flow-forming as described above.

In a more preferred embodiment, after the transverse cold-rolling (preferably, the material that has been transverse cold-rolled is used to cut out a disc or rectangular shaped material which is then used to form the preform.), the cold-working of the rolled work piece to obtain a shaped work piece is preferably accomplished by deep drawing the rolled work piece to form a preform having a cup shape. Afterwards, the pre-formed material is preferably then subjected to flow forming over a mandrel in order to form the final shaped work piece which is typically the shape of a cup as shown in FIG. 3. This multi-directional cold-working of the work piece by means of flow forming provides numerous advantages, including, but not limited to, importing a greater amount of shear strain in the shaped workpiece, resulting in a finer and more uniform grain size in the shaped workpiece after annealing.

Preferably, the predetermined target shape is further stress relieved or annealed after the step of cold-working at step 125, as indicated by the broken lead arrows, preferably at temperatures of from about 600° C. to about 850° C. for stress relieving and from about 950° C. to about and 1300° C. for annealing, though other temperatures can be used. Stress relieving or annealing operation 125 is conducted in vacuum or an inert atmosphere for a preferred period of from about 15 minutes to about 2 hours. The homogeneity of strain in the shaped workpiece (SW) ensures that the sputtering metal responds uniformly to annealing, thus ensuring a substantially consistent grain structure and/or texture around at least the regions of the interior sidewalls of the completed sputtering target. The shaped workpiece may be machine-cleaned at step 130 for yielding the sputtering target such that it conforms to the dimensional requirements specified by the OEM. As previously mentioned, the sputtering target can be formed without the step of machine-cleaning, as long as the shaped workpiece satisfies the surface finish requirements defined by the OEM. In a preferred embodiment, the sputtering target is cup-shaped or cylindrical, and has a height of about 10.5 inches, an inner diameter of about 9.25 inches, an outer diameter of about 9.50 inches, and a sidewall thickness of about 0.25 inch.

The sputtering target of the present invention preferably has flanges which are a part of the sputtering target. In other words, the flanges are integral or part of the same unitary piece as the sputtering target thus eliminating the welding of separate flanges to the sputtering target. The flanges can be formed by rolling over the edges of the sputtering target to the desired flange length. This rolling can be accomplished by utilizing excess heavy gauge material at mouth of the part, or by utilizing the "hold downs" from a deep draw process. The edge of the target, for instance, is shown by numeral 27 as shown in FIG. 1.

Performing the method steps according to the present invention for making a sputtering target advantageously provides a target that erodes substantially uniformly during sputtering and that yields a substantially uniform deposition of target material on a substrate, while at the same time obviating the need for complex and expensive components, such as moving components and/or additional components in the sputtering apparatus for achieving the above advantages. The sputtering target made by performing the steps of the method according to the present invention preferably exhibits a substantially consistent grain structure and/or texture at least about all regions of the interior sidewalls thereof. Any strain within the sputtering target is preferably substantially uniformly distributed throughout at least the sidewalls thereof, resulting in a uniform annealing response and sputtering erosion.

In one embodiment, the target made of at least one valve metal preferably has a fine grain size and/or uniform grain size. In addition, the target preferably has a homogeneous texture. In more detail, preferably, the target containing at least one valve metal has a grain size of 5 ASTM or higher (i.e., or finer), more preferably from about 5 ASTM to about 13 ASTM, even more preferably from about 5 ASTM to about 10 ASTM, and most preferably from about 7 ASTM to about 9 ASTM. In addition or alternatively, the target has a uniform grain size, for instance, wherein the grain size variance throughout the target is ±2 ASTM, or ±1 ASTM, or less. In addition or alternatively, the target can have an excellent texture such as a mixed (111)-(100) global texture which is preferably free of sharp, localized bands of strong (100) texture. In other words, the texture is such that the grain having the (100) orientation normal direction to the sputter surface are scattered such that there are no localized groupings of the (100) texture detected. Preferably, the target of the present invention is at least partially recrystallized such that at least 75% of the target is recrystallized and more preferably at least 95% of the target is recrystallized and even more preferably at least 98% of the target is recrystallized. Most preferably, the target is fully recrystallized (i.e., 100% recrystallized). Preferably, the target has one or more or all of the above-described properties with respect to texture and grain size. The target preferably has a HCM design as described above and has one or more or all of the above characteristics.

In a preferred embodiment, the methods of the present invention orient the grains of the target in such a way that stray magnetic fields are substantially avoided or totally eliminated. The stray magnetic fields are preferably avoided as a result of minimizing dislocated grains. In other words, in a preferred embodiment, the present invention improves the alignment of the magnetic field such that the orientation of the magnetic field is the same or substantially the same. This permits the orientation of the magnetic field to be parallel to the sputtered material flow thus avoiding competing or interfering magnetic fields. This preferably results in improved sputtering quality and/or efficiency which is highly desirable by end users.

Preferably, according to the present invention, a sputtering target produced as described above is placed into an outer shell or liner, such as outer shell 20 in FIG. 1. The outer shell is made of a material which is lighter and less expensive than the valve metal of the sputtering target, thus avoiding an unnecessary addition of weight to the sputtering target and therefore making a mounting of the sputtering target and outer shell sputtering assembly in a sputtering vacuum chamber relatively easier, while at the same time saving costs. Preferably, also, the outer shell is made of a non-hydriding material, such as a non-hydriding metal. Examples of a non-hydriding metal include, but are not limited to, aluminum or copper.

A metal jacket or backing can preferably be part of the sputtering target by bonding a metal backing plate such as a copper plate onto the valve metal plate prior to cold working of the material. For instance, the metal backing plate can be bonded on by such techniques as explosive bonding, mechanical bonding, roll bonding, and the like. Once the metal backing plate is attached onto the valve metal plate, then the combined plate with backing can then be subjected to the process of the present invention as described above. This particular method of attaching the metal backing or jacket onto the valve metal target avoids the additional steps used by end users wherein end users typically receive a tantalum target, for instance, and then must slip on a copper metal jacket onto the already formed sputtering target (e.g., a target in the shape of a can) which results in additional manufacturing and labor cost as well as time delays. By forming the backing as part of the valve metal plate prior to the formation of the sputtering target, manufacturing costs and time delays can be greatly reduced.

A function of the outer shell is to impart structural integrity to the sputtering target. Thus, the presence of an outer shell permits the sputtering target material along the interior wall of the HCM to be almost completely consumed, for example, to a liner thickness of less than 0.1". Without the outer shell, a sputtering target could not be eroded to its minimum desired thickness without losing its structural integrity.

When the outer shell is made of a non-hydriding material, it allows the recovery of valve metal from a used sputtering target. By exposing the composite HCM target to a positive pressure atmosphere of hydrogen at a temperature above about 450° C., the tantalum metal interior liner will absorb hydrogen and become friable while the non-hydriding material remains tough and ductile The hydrided valve metals can be reclaimed from the composite HCM target by mechanical means such as vibrating or scraping. The outer shell may therefore be advantageously reusable and the unused parts of the sputtering material recovered and recycled.

According to another aspect of the present invention, as depicted by way of example by top portion 15' in FIG. 3, the top portion 15' may be distinct from the sputtering target 3' and be made of a sputtering-resistant material. The top portion is preferably welded or otherwise attached to the sidewalls of the cylindrical sputtering target 3' to yield a finished sputtering target assembly 4'. Preferably, the top portion is made of a valve metal base material having a large grain size and a strong (100) texture. Sputtering rate can be dependent on texture. Since tantalum targets having (100) texture bands are highly resistant to sputtering, according to a preferred embodiment, the top portion may be made of a Ta-base or an Nb-base material having a strong (100) texture. The valve metal base material can be a commercially pure valve metal, such as tantalum or niobium, which has been especially processed to attain a strong (100) texture, or it can be a valve metal alloy, such as, for example, a tantalum-tungsten alloy and the like, which typically exhibits a strong (100) texture as mentioned in C. A. Michaluk, Masters Thesis, Drexel University, 1993; G. T. Gray III, S. R. Bingert, S. I. Wright, and S. R. Chen, Influence of Tungsten Alloying Additions on the Mechanical Properties and Texture of Tantalum, Material Research Society Symposium Proceedings, Volume 322, Materials Research Society, 1994, pp. 407-412; S. I. Wright, S. R. Bingert, and M. D. Johnson, Effect of Annealing Temperature on the Texture of Rolled Tantalum and Tantalum 10 wt. % Tungsten, Utungsten and Refractory Metals 2, A. Bose and R. J. Dowding (eds.), Metal Powder Industries Federation, Princeton, 1995, pp. 501-508, all incorporated herein in their entirety by reference. The top portion may also be made of another sputtering-resistant material, as is within the knowledge of one skilled in the art. According to another aspect, the top portion is made of a sputtering-resistant, non-hydriding material, within the knowledge of one skilled in the art, that makes possible a recovery of valve metal from a used sputtering target as described above. Providing a non-sputtering top portion for the sputtering target advantageously limits erosion to the sidewalls of the sputtering target while retarding the sputtering rate along the top interior surface thereof. the above advantage is desirable in further ensuring a deposition of a uniform layer on the substrate, because atoms ejected from the top interior surface of the target may pass through the plasma without becoming ionized and continue on a non-perpendicular trajectory towards the substrate. These atoms will impact the substrate at an angle, building up on the walls on the channels thereof, and will create a fill void at the bottom of these channels. On the other hand, should an ejected sidewall atom not become ionized, it will simply deposit on the opposite interior sidewall of the target. For this reason, making the top interior surface of the target of a non-sputtering material substantially avoids the impacting by non-ionized atoms of the substrate at an angle, and therefore a non-uniform deposition of material thereon.

According to one aspect of the present invention, a spent sputtering target is processed to allow recovery of the remaining valve metal. Preferably, the spent sputtering target is first subjected to a hydriding step during which the valve metal is hydrided to produce a very brittle material, and the hydrided valve metal is separated from the non-hydrided shell by conventional removal or separation techniques. Thereafter, the hydrided valve metal is milled to produce a valve metal hydride powder. The valve metal hydride powder is then preferably degassed by heating in a vacuum to a temperature above about 450° C. to remove the hydrogen, thus yielding a valve metal powder. The powder may then be further processed according to the methods of the present invention to make a sputtering target.

The present invention will be further clarified by the following examples, which are intended to be exemplary of the present invention.

EXAMPLES

Two commercially available niobium plates and two commercially available tantalum plates from Cabot Corporation were used in the examples. Each of the niobium and tantalum plates were cross rolled several times as described in the present application. The plates originally had a thickness of 3.5 inches and through the cross-rolling process resulted in a thickness of 0.500 inches. The cross cold rolling was accomplished such that the rolling was done the same number of times in one direction and in a second direction perpendicular to the first direction. A disc having a dimension of 0.500"× 18.0" diameter was cut from each of the plates. In making the preform, each of the discs were drawn into a preform which had the shape of a cup by the use of a 1000 ton press. The cup shaped preform had the following dimensions after being subjected to the 1000 ton press: about 6.6" height with about 0.500" wall thickness, wherein the wall had a 1° tapered edge. The inner diameter of the cup was about 9.3". The inner diameter radius of the cup was about 1.2" on the bottom corners with an outer diameter radius of about 1.6" on the outside corners.

In making the finished product, the preformed cup was then placed on a mandrel. The mandrel was machined to the desired diameter of the end product and surface finished. The preformed cup was then subjected to flow-forming to the required wall thickness and length as indicated below. The flow-forming operation was completed at Dynamic Machine Works. After the flow form processing, the finished part was then machined to the desired finished dimensions.

The finished part dimensions were as follows:

About 9.9" height, about 0.255" wall thickness with about 1° tapered edge, about 9.49" inner diameter, with a radius of about 1.2" on the bottom inner diameter corners and with a radius of about 1.36" on the bottom outer diameter corners. One of the niobium samples and one of the tantalum samples was subjected to annealing between the steps of the cross or transverse cold-rolling and the formation of the preform while the other niobium and the other tantalum samples avoided an annealing step between the steps of the transverse cold-rolling and the formation of the perform by cold-working. The annealing step was done at 1050° C. for the tantalum and was held for 2 hours. The annealing for the niobium product was done at 1,150° C. and held for 2 hours.

For each of the samples, the finished product that was formed was subjected to a final annealing wherein the annealing for the niobium formed from an unannealed plate was at 1100° C. and held for 2 hours; the final annealing for the niobium formed from an annealed plate was at 1250° C. and held for 2 hours; the final annealing for the tantalum formed from an unannealed plate was at 1100° C. and held for 2 hours; and the final annealing for the tantalum formed from an annealed plate was at 1050° C. and held for 2 hours.

The microtexture uniformity was obtained for each of the samples using the test procedure described in U.S. patent application Ser. No. 09/665,845, which is incorporated in its entirety by reference herein and forms a part of the present application. To assure fair comparison of texture data, the step distance used for collecting the electron back scattered defraction (EBSD) raw data was ⅕ of the average grain size determined in both the X an Y direction. As set forth in the table below, the precent recrystallization as well as the grain size are shown.

TABLE I

METALLOGRAPHY RESULTS

| Temp | | Top Wall | Mid Wall | Radius | Mid Base |
|---|---|---|---|---|---|
| Tantalum Crucible (Hollow Cathode Target) - Annealed Final Rolled Workpiece (FRW) | | | | | |
| 1050° C. | % Recrystallized | 100 | 100 | 100 | 100 |
| | ASTM Grain Size | 5.0 | 5.1 | 7.1 | 6.4 |
| | Micron Grain Size | ~65 | ~62 | ~30 | ~40 |
| Tantalum Crucible (Hollow Cathode Target) - Unannealed Final Rolled Workpiece (FRW) | | | | | |
| 1100° C. | % Recrystallized | 100 | 100 | 96 | 99 |
| | ASTM Grain Size | 7.3 | 7.2 | 6.4 | 6.6 |
| | Micron Grain Size | ~30 | ~32 | ~40 | ~38 |
| Niobium Crucible (Hollow Cathode Target) - Annealed Final Rolled Workpiece (FRW) | | | | | |
| 1250° C. | % Recrystallized | 100 | 100 | 100 | 100 |
| | ASTM Grain Size | 8.7 | 8.6 | 7.6 | 8.7 |
| | Micron Grain Size | ~19 | ~19 | ~19 | ~19 |

TABLE I-continued

METALLOGRAPHY RESULTS

| Temp | | Top Wall | Mid Wall | Radius | Mid Base |
|---|---|---|---|---|---|
| Niobium Crucible (Hollow Cathode Target) - Unannealed Final Rolled Workpiece (FRW) | | | | | |
| 1100° C. | % Recrystallized | 100 | 100 | 100 | 100 |
| | ASTM Grain Size | 9.3 | 9.3 | 9.3 | 9.3 |
| | Micron Grain Size | ~15 | ~15 | ~15 | ~15 |

TABLE II

TEXTURE RESULTS
(Mid-Wall Samples, Optimum Anneal Temperature)

| | Electron Back Scatter Defraction EBSD Grain Size (microns) | Lambda($\lambda$) Rad mm | Omega($\Omega$) Rad mm |
|---|---|---|---|
| Tantalum, Annealed SMW | 64 | 92 | 15 |
| Tantalum Unannealed SMW | 22 | 238 | 84 |
| Niobium Annealed SMW | 17 | 162 | 92 |
| Niobium Unannealed SMW | 10 | 236 | 198 |

The texture analysis showed an improvement in texture homogeneity especially with respect to the samples that started with the annealed plate. In particular, annealed sputtering targets formed from unannealed FRW had a more severe textural gradient as demonstrated by a larger value for lambda, and more severe textural banding as revealed by a larger value of omega. Variability in texture has been reported to correlate to variability in sputtering performance in tantalum (C. A. Michaluk, D. B. Smathers, and D. P. Field, Affect of Localized Texture on the Sputter Performance of Tantalum, Proceedings of the Twelfth International Conference on Texture of Materials, J. A. Szpunar (ed.), NRC Research Press, Ottawa, 1999, pp. 1357-1362, incorporated in its entirety by reference.) Also, as can be seen from the above results, the benefit of using an unannealed plate in the forming process is that the final annealed crucible has a finer grain size. The benefit of starting with an annealed plate is an improvement in texture homogeneity in the final crucible as well as the ease in forming the part. Furthermore, employing an annealed FRW has a more uniform grain structure, as evident from the grain size distribution plots provided in FIGS. 6-9, as measured by TSL using an Electron Backscatter Defraction analysis techniques as referenced in U.S. patent application Ser. No. 09/665,845. Thus, each method has benefits depending upon the desired needs of the end user and the present invention provides various options in satisfying end user requirements.

It will be apparent to those skilled in the art that various modifications and variations can be made to the embodiments of the present invention without departing from the spirit or scope of the present invention. Thus, it is intended that the present invention cover other modifications and variations of this invention within the scope of the appended claims and their equivalents.

What is claimed is:

1. A method of making a hollow cathode magnetron sputtering target comprising the steps of:

providing a sputtering metal workpiece comprising at least one valve metal;

transverse cold-rolling the sputtering metal workpiece to obtain a rolled workpiece; and cold-working the rolled workpiece to obtain a shaped workpiece that is hollow cylindrical or cup-shaped, wherein said valve metal is tantalum, niobium, or an alloy thereof, and wherein the step of cold-working the rolled workpiece comprises deep-drawing the rolled workpiece, spin-forming the rolled workpiece, or flow forming the rolled workpiece, or combinations thereof; and further comprising cutting a disc shaped work piece from said rolled work piece prior to cold-working the rolled work piece.

2. The method of claim 1, wherein the sputtering metal workpiece is not annealed or stress relieved between the steps of transverse cold-rolling and cold-working.

3. The method according to claim 1, further comprising a step of machine-cleaning the shaped workpiece to obtain the sputtering target.

4. The method according to claim 1, wherein the step of transverse cold-rolling comprises the step of cold-rolling the sputtering workpiece as a rolling workpiece as many times in the first direction as in the second direction.

5. The method of claim 1, wherein the step of cold-working the rolled workpiece comprises first deep drawing the rolled workpiece to form a preform, and then flow forming the preform over a mandrel.

6. The method according to claim 1, wherein the shaped workpiece exhibits at least 50% cold reduction with respect to the rolled sputtering metal workpiece (SMW).

7. The method according to claim 1, wherein a sidewall of the shaped workpiece exhibits less than 50% cold reduction with respect to the rolled workpiece.

8. The method according to claim 1, wherein the step of cold-working the rolled workpiece comprises deep-drawing the rolled workpiece or spin-forming the rolled workpiece, or both.

9. The method according to claim 1, wherein the sputtering target is cup-shaped or cylindrical and has a height of about 10.5 inches, an inner diameter of about 9.25 inches, an outer diameter of about 9.50 inches and a sidewall thickness of about 0.25 inch.

10. The method of claim 1, wherein said shaped work piece has an edge, wherein said edge is subjected to cold-rolling in order to form a flange.

11. The method of claim 1, wherein said cold-working is a multi-directional cold-working.

12. The method according to claim 1, wherein the step of transverse cold-rolling comprises the step of cold-rolling the sputtering workpiece as a rolling workpiece a number of times in a first direction and a number of times in a second direction perpendicular to the first direction.

13. The method according to claim 12, wherein the step of transverse cold-rolling comprises the steps of:

cold-rolling the sputtering workpiece a number of times in the first direction, and thereafter cold-rolling the rolling workpiece a number of times in the second direction.

14. The method according to claim 1, wherein the rolled workpiece has a predetermined cold-rolling thickness.

15. The method according to claim 14, wherein the predetermined cold-rolling thickness is from about 0.25 inch to about 2"-gauge.

16. The method according to claim 1, further including a step of annealing the sputtering metal workpiece before the step of transverse cold-rolling.

17. The method according to claim 16, wherein the step of annealing before the step of transverse cold-rolling is at a temperature of from about 1050° C. to about 1300° C.

18. The method according to claim 16, wherein the step of annealing before the step of transverse cold-rolling comprises the step of annealing the sputtering metal workpiece for about two hours.

19. The method according to claim 1, further comprising a step of stress relieving the shaped workpiece after the step of cold-working.

20. The method according to claim 19, wherein the step of stress relieving after the step of cold-working occurs at a temperature of from about 600° C. to about 850° C.

21. The method according to claim 1, further comprising a step of annealing the shaped workpiece after the step of cold-working.

22. The method according to claim 21, wherein the step of annealing after the step of cold-working occurs at a temperature of from about 900° C. to about 1300° C.

23. A method of recovering valve metal from a spent sputtering target made according to the method of claim 1 comprising a step of hydriding the valve metal to obtain hydrided valve metal.

24. The method according to claim 23, further comprising the steps of:

separating the hydrided valve metal from non-hydrided metal shell;

milling the hydrided valve metal to obtain valve metal hydrided powder;

degassing the valve metal hydrided powder to obtain degassed valve metal powder, and processing the degassed valve metal powder to obtain a valve metal ingot.

25. The method according to claim 1, further including a step of stress relieving the sputtering metal workpiece between the steps of transverse cold-rolling and cold-working.

26. The method according to claim 25, wherein the step of stress relieving is at a temperature of from about 600° C. to about 850° C.

27. The method according to claim 26, wherein the step of stress relieving comprises the step of stress relieving the sputtering metal workpiece for about 2 hours.

28. The method according to claim 1, further including a step of annealing the sputtering metal workpiece between the steps of transverse cold-rolling and cold-working.

29. The method according to claim 28, wherein the step of annealing is at a temperature of from about 950° C. to about 1300° C.

30. The method according to claim 29, wherein the step of annealing comprises the step of annealing the sputtering metal workpiece for about 2 hours.

31. The method of claim 1, wherein said sputtering metal work piece is a first plate, and further comprising bonding a second metal backing plate onto the first plate prior to subjecting the rolled work piece to cold-working.

32. The method of claim 31, wherein said bonding is explosive bonding, mechanical bonding, roll bonding, or combinations thereof.

33. The method of claim 31, wherein said second metal backing plate is copper.

34. The method of claim 31, wherein said second metal backing plate is a metal different from said sputtering metal work piece.

35. A method of making a hollow cathode magnetron sputtering target comprising:
  a) providing a sputtering metal workpiece comprising at least one valve metal, wherein the step of providing a sputtering metal workpiece comprises steps of forging flat an ingot comprising at least one valve metal, cutting the forged ingot into slabs, and machine-cleaning the slabs and;
  b) transverse cold-rolling the sputtering metal workpiece to obtain a rolled workpiece; and
  c) cold-working the rolled workpiece to obtain a shaped workpiece that is hollow cylindrical or cup-shaped, wherein said valve metal is tantalum, niobium, or an alloy thereof, and
 wherein the step of cold-working the rolled workpiece comprises deep-drawing the rolled workpiece, spin-forming the rolled workpiece, or flow forming the rolled workpiece, or combinations thereof.

* * * * *